United States Patent [19]

Shepherd

[11] 4,215,194

[45] Jul. 29, 1980

[54] METHOD FOR FORMING THREE-DIMENSIONAL OBJECTS FROM SHEET METAL

[75] Inventor: Stephan C. Shepherd, Winnetka, Ill.

[73] Assignee: Masterwork, Inc., Chicago, Ill.

[21] Appl. No.: 880,022

[22] Filed: Feb. 21, 1978

[51] Int. Cl.² ............................................. G03C 5/00
[52] U.S. Cl. ................................. 430/323; 156/634; 156/645; 156/656; 156/659.1; 427/272; 430/394; 430/325; 29/118; 29/557; 29/558; 72/379
[58] Field of Search ............... 96/36, 38.1, 38.2; 29/18, 557, 558; 72/379; 156/634, 645, 656, 659; 427/270, 272, 275

[56] References Cited

U.S. PATENT DOCUMENTS

| | | | |
|---|---|---|---|
| 2,710,791 | 6/1955 | Gaul | 156/645 |
| 3,325,319 | 6/1967 | Frantzen | 156/645 X |
| 3,503,815 | 3/1970 | Johnson | 156/645 X |
| 3,508,108 | 4/1970 | Salisbury | 156/645 X |
| 3,723,269 | 3/1973 | Hofling | 156/645 X |
| 3,895,947 | 7/1975 | Sarka | 96/36 |
| 3,959,527 | 5/1976 | Droege | 96/38.1 X |
| 3,962,002 | 6/1976 | Finkbeiner et al. | 156/645 X |

Primary Examiner—Edward C. Kimlin
Attorney, Agent, or Firm—Robert E. Wagner; Gerald T. Shekleton

[57] ABSTRACT

A method for chemically milling sheet metal to form three-dimensional objects comprising masking the sheet metal by selectively applying a resist material to opposite sides of the sheet metal to form a design, applying an etchant to the masked metal which erodes the metal according to the design, and simultaneously forming connecting tabs and score lines. The tabs and score lines allow certain design portions to be bent to different planes to form the three-dimensional object.

5 Claims, 10 Drawing Figures

U.S. Patent
Jul. 29, 1980
4,215,194
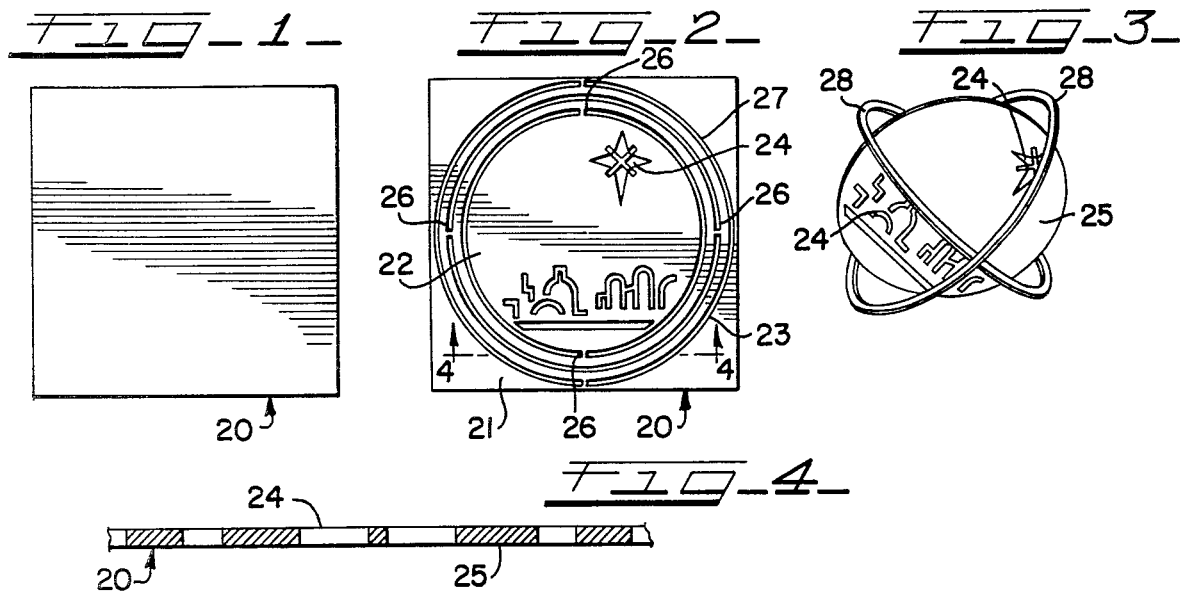
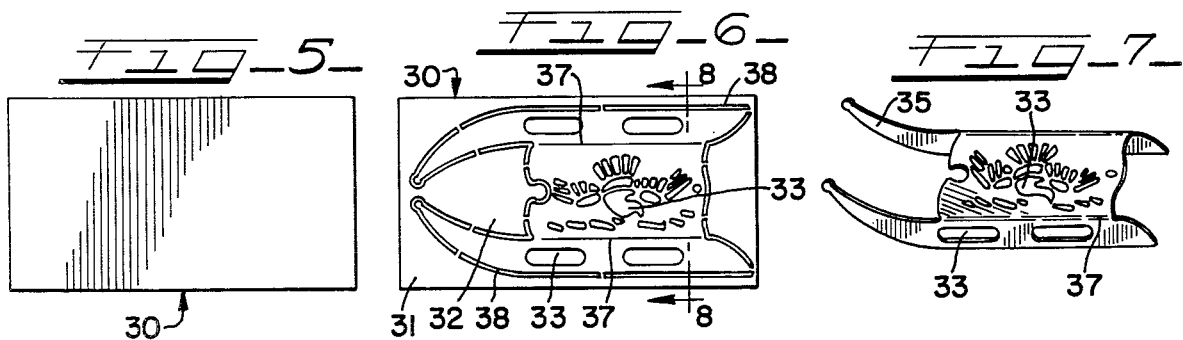
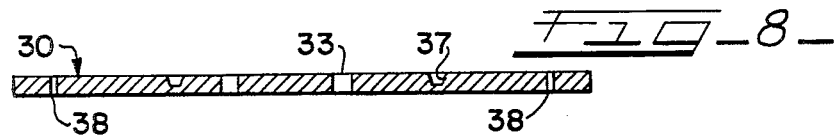

METHOD FOR FORMING THREE-DIMENSIONAL OBJECTS FROM SHEET METAL

BACKGROUND OF THE INVENTION

This invention relates to metal working, and in particular, relates to a method for chemically milling and forming three-dimensional objects from sheet metal.

The traditional method for forming designs in metal objects from sheet metal has been through the use of large mechanical presses for stamping out the desired design. Such a method entailed expensive precision-machined molds and high labor costs in order to form the desired metal design. In addition to this high initial capital investment in the presses and tools, the tools were subject to wear, especially working with a material such as metal, thereby increasing the cost of production. The necessity for skilled labor for the set up and run for stamping out a particular design further increases the overall cost of this traditional method.

Therefore, an object of the subject invention is an improved and inexpensive method of forming a desired intricate pattern in sheet metal.

Another object of the subject invention is a method of chemical milling whereby a desired intricate pattern might be formed in sheet metal for the production of three-dimensional articles.

A still further object of the subject invention is an improved method of forming a three-dimensional article from sheet metal whereby substantially identical designs are etched on both sides of the sheet metal.

A still further object of the subject invention is an improved method of forming a three-dimensional article from sheet metal whereby substantially different designs are etched on both sides of the sheet metal.

A further object of the subject invention is an improved method of forming three-dimensional articles from sheet metal by selectively etching score lines in the design on one side of the sheet metal and not etching the same score lines on the opposite side of the sheet metal whereby the pattern thereby created may be folded along the score lines.

These and other objects are attained in accordance with the present invention, whereby metallic objects are manufactured having intricate patterns or designs, such as Christmas tree ornaments and other ornamental or functional metal pieces, by an improved process of chemical milling. In this process, articles of relatively thin metal are formed with openings in an intricate pattern to secure a design which may be either pleasing to the eye or functional. These articles may be made three-dimensional by selective folding along score lines and tabs formed by the inventive process, as will be described.

In the subject process, a chemical resist material is applied to a flat sheet of metal in the form of a desired design. The resist material is not applied to those areas which will formulate the design. This practice is well known and widely used in other arts such as screen printing and the like, and in fact, screen printing procedures may be used in the application of the resist materials. These resist materials are applied to both sides of the metal plate in identical design and placement, with exceptions as noted below. An etchant is applied to the plate in accordance with the desired design. This etchant solution will dissolve the metal at those areas on the metal plate where there is an absence of resist material, however, will not affect the plate where resist material has been applied. By placing the etchant on both sides of the plate, it will erode or dissolve the metal and form an opening in the plate in the desired design by virtue of the above-described selective placement of the resist material on the plate. After the eroded metal and resist are washed away, the metal may be reclaimed by processes well known in the art, if the object is formed from precious metals such as gold, silver or even copper.

In order to form the three-dimensional articles, the etched metal is folded along score lines, hyphenated lines, or tabs which are formed by the subject inventive method to achieve the three-dimensional appearance.

In one embodiment of the invention, the lines on which these articles are folded have been scored so as to allow an easy and accurate folding of the object along those lines. This scoring is accomplished through the selective placement of the resist material on one side only of the metal plate along the line which is to be scored, while on the opposite side of the plate, resist material is not placed on this score line. This selective placement of the resist material allows one side of the plate to become partially eroded on the application of the etchant solution to provide the score line. The placement of the resist material on the other side of the metal, as well as the control of the amount of etchant, assures that the metal plate will not be completely eroded on that line and, therefore, no opening will form. However, a score line is formed on which the metal may be folded.

In another embodiment of the subject invention, small tabs are formed through the above-identified method of selective placement of the resist material. The tabs connect selected areas of the design and allow the connected areas to be folded or twisted at the tabs to form the desired three-dimensional article. The tabs may be etched on one side if desired, but generally neither side of the tabs will be etched to achieve the strength necessary in the use of such a small area and support the metal portion being twisted out of the original plane of the metal. A plurality of tabs may also be used to achieve an effect similar to the score lines described above.

DESCRIPTION OF THE DRAWINGS

Further objects of the subject invention, together with additional features contributing thereto and advantages accruing therefrom, will be apparent from the following description of the invention when read in conjunction with the accompanying drawings wherein:

FIG. 1 is a top plan view of a piece of sheet metal that may be used in the subject inventive method;

FIG. 2 is a top plan view of the sheet metal which has been etched to form a design by the method of the subject invention;

FIG. 3 is a perspective view of a completed object of art which has been formed according to the method of the subject invention;

FIG. 4 is a cross section taken along the line 4—4 of FIG. 2 showing the open areas forming the design which has been etched according to the method of the subject invention;

FIG. 5 is a top plan view of a sheet metal plate;

FIG. 6 is a top plan view of the sheet metal plate of FIG. 5 which has been etched to form a design using the method of the subject invention;

FIG. 7 is a perspective view of an object of art formed by the method of the subject invention;

FIG. 8 is a cross-sectional view taken along the line 8—8 of FIG. 6 showing the open portions and score lines formed by the method of the subject invention;

FIG. 9 is a cross-sectional view showing the different strata of a metal plate having a dry resist applied to it; and, FIG. 10 is a cross-sectional view of a metal plate having a wet resist applied thereto.

Referring now to FIGS. 1 and 5, three-dimensional articles may be formed from sheet metal, such as shown at 20 and 30, through the use of the chemical milling process of the subject invention. In general, the process involves the application of a resist material to the metal plate in the form of the desired design, the design being formed by alternate areas of the sheet metal in contact with the resist material on it, and areas of the sheet metal, which form both a design on the object and the outline of the object, are not contacted by the resist material, and thus exposed. As shown in FIG. 2, areas 21 and 22 are covered by resist material, leaving areas 23 and the outline 27 of the object exposed. An etchant is applied to the sheet metal 20 on both sides, preferably by spraying. The etchant erodes the metal where it is exposed while the resist material protects that portion of the sheet metal with which it is in contact from such erosion. Where the sheet metal is eroded on both sides on a particular portion, openings 24 develop to form the design (FIGS. 3 and 4). Where the sheet metal is eroded only on one side, a score line 27 or design feature is formed on that side of the sheet metal. The masked area on which the resist has been placed leaves untouched or uneroded areas 25 and 28, which, with the openings 24, form the desired design. The small areas 26 which are masked form tabs which, after erosion by the etchant, connect the uneroded areas in a manner which allows the connected areas 25 and 28 to be placed in different planes, as shown in FIG. 3, to form the desired object of art. A plurality of tabs may be necessary to form a hyphenated line if the material used is of a thickness to require more support.

When forming some objects by the method of the subject invention with different metals of different thicknesses, it may be desirable to utilize a score line 37 (FIGS. 6 and 7), rather than a tab 26 to connect those parts in different planes. To form the score line, a piece of sheet metal 30, similar to the sheet metal 20 of FIG. 1 in size, is masked with resist material as in FIG. 2 to expose the selected areas 32, 33 and the outline 38. Score line 37 is masked on one side and exposed on the other side so that when the etchant is applied, the score line 37 is eroded only partially through the plate metal 30, which allows the resulting pattern to be easily folded into a different plane along that line.

Generally, any metallic plate material may be formed by the subject inventive method through chemical milling. Each different plate material will generally take a different etchant solution as set forth below.

Gold—Aqua Regia
Copper—Cupric Chloride/H$_2$O
Bronze—A buffered water solution of ferric chloride
Silver—Silver Nitrate
Brass—A buffered water solution of ferric chloride In general, the above solutions may be rinsed off with water. The resist material itself must be a chemical which will not tarnish the metal greatly and may comprise an alkaline resist which may be rinsed off with an alkaline solution, a semi-aqueous resist which is rinsed off by an alkaline-solvent mixture, or a solvent stripper which may be rinsed by a special solvent stripper of commercially available types.

With the design openings, the outline of the object and score lines eroded, the remaining sheet metal is rinsed with water or other appropriate rinse material and the three-dimensional article is formed by folding along the appropriate score lines 37 (FIG. 6) or tabs 26 (FIG. 2) to place sections of the metal object in different planes from the plane of the sheet metal to form objects such as in FIGS. 3 and 7.

In the application of the etchant, by spraying, it has been found that the depth of the erosion from a given side may be controlled to a great degree. As an example, a score line may be cut as deep or as shallow as desired by controlling the time and quantity of etchant sprayed onto the masked metal. When etching the openings of a design, one can work a 0.010" thickness of sheet metal by eroding, for example, 0.003" away on one side and 0.007" away on another side, or the etchant spray may be adjusted to erode equal metal thicknesses, as desired.

The above generalized description of the method of the subject invention may be used with the chemical milling processes known today. Of these chemical milling processes, the silk screen, photo-resist dry film and photo-resist wet film are the most commonplace and will be described in greater detail below as relates to the subject invention. In each of these processes, an inked drawing is first made of the exact design wished to be produced in metal. The drawing is photographed and a film negative or positive prepared. The individual film is reproduced in the desired size on sheets comprising a matrix of such film images, for instance, of 30 or 35 such images disposed in appropriate rows and columns. When scoring the sheet metal, one sheet of these images is left as is and a second sheet is retouched by air brushing or the like to eliminate those lines which are desired to be score lines or scored tabs. These films are then used in the process of the subject invention as will be explained. As is known to those skilled in the art, the use of either positives or negatives may be employed in these chemical milling processes, dependent on the object being formed, the materials on hand, and the economics of the various processes which might be used.

In the chemical milling procedure utilizing a screen printing procedure, the screen having the desired design may be formed by the application of a photosensitive resist material to the screen. One such method is to selectively harden portions of an appropriate emulsion on the screen to form a positive on the screen as is well known in the art. The print screen is placed over the sheet metal and a resist is pushed through the interstices of the screen for contact with the plate metal and let dry. The etchant is applied and erodes the metal in the desired pattern and is then rinsed off with a suitable rinsing agent. This procedure is repeated on the opposite side of the sheet metal with a similar screen or one having certain lines blocked out if score lines are desired, taking care to align and register the design with that formed on the opposite side of the sheet metal. The finished design may then be formed to the three-dimensional object as described above.

In the photo-resist dry film method, a dry chemical resist material 41 (FIG. 9) is placed on the sheet metal 40 and covered and protected on the metal surface 40 through a transparent plastic film 42 which is preferably Mylar ® plastic. The opposite side of the metal plate 40 is similarly coated with the dry chemical photo-resist 41 and covered with the plastic film 42. The film 42 serves the dual purpose of protecting the dry photo-resist on the metal plate 40 and allowing the passage of light while making the coated metal 45 easier to handle when so coated with the Mylar ® film 42. So coated, the photo-resist 41 will not stick or will not be removed by any transfer apparatus. The metal 45 is coated by passing the metal 45 and film 42 over a heat source (not shown) which warms and partially liquifies the photo-resist dry film, distributing it in a uniform stratum and causing the film to adhere to the metal. The original and retouched positives which are prepared as described above are then placed over opposite sides of the metal and registered to one another. The entire assembly is then passed through banks of lights to irradiate the coated metal. After both sides of the metal are exposed to the lights in such a manner, the positives and Mylar ® plastic film are removed and the exposed assembly is rinsed with the appropriate chemical to develop the photo-resist, thereby forming the desired design in outline form in the irradiated areas with the cured photo-resist material on the metal plate. Etchant is then applied to the assembly by rolling, dipping, spraying or other suitable means. The etchant erodes the metal according to the design and is rinsed off. The pattern thus prepared may be formed into the three-dimensional article as described above.

In the photo-resist wet method, the metal plate 50 is coated with a photosensitive emulsion 51 by dipping, spraying or rolling and the emulsion 51 is cured through baking or air drying as necessary. The emulsion-coated metal 51 is then masked with the negative or positive films as described and prepared in the manner described above. The retouched film is placed on one side of the metal and aligned with the original film on the opposite side so that identical patterns will be reproduced on each side of the metal plate. The masked assembly may then be placed in a vacuum frame between opposing panes of transparent material and vacuum applied to assure that a flat surface and conformance of the film mask is achieved with the metal. The vacuum frame with the masked assembly is then exposed to irradiation of the appropriate wave length for the resist material being used, and the undeveloped emulsion is rinsed off with an appropriate rinse agent to form the desired design in the emulsion coating on the metal plate. Etchant is then sprayed or otherwise applied to the coated metal to selectively erode the metal and form the openings and score lines in the desired pattern. This design may then be formed into the desired three-dimensional object in the manner described above.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:
1. A method for forming three-dimensional metallic objects from sheet metal comprising the steps of:
    (a) preparing first and second films of a desired design;
    (b) applying a light sensitive resist material to opposite sides of the sheet metal;
    (c) retouching said first film by eliminating a selected line on said first film, placing said first film over a first side of the sheet metal, placing said second film over a second side of the sheet metal;
    (d) registering said first film with said second film to assure proper alignment of the design on the sheet metal;
    (e) securing said first and second films in the registered position to form a masked assembly;
    (f) exposing said masked assembly to light of a wavelength which will render said resist material insoluble;
    (g) removing said first and second films;
    (h) washing unexposed resist material from said masked assembly with a rinse agent;
    (i) drying the exposed masked assembly;
    (j) applying an etchant to said exposed masked assembly in a controlled manner thereby forming openings in the sheet metal corresponding to said desired design and forming score lines on said second side of the sheet metal;
    (k) washing said etchant from said masked assembly;
    (l) removing said exposed resist material from said sheet metal; and
    (m) bending portions of said etched metal to different planes to form a crease along said score lines whereby an object incorporating design portions in different planes is formed, said adjacent design portions being joined to one another by said crease.

2. A method for forming a three-dimensional object from sheet metal comprising the steps of:
    (a) masking selected portions of the sheet metal with a resist to form identical designs on opposite sides of said sheet metal;
    (b) exposing the masked metal to an etchant a length of time effective to erode the metal a desired amount in the shape of said design and leaving portions of said design connected to adjacent portions by small tabs;
    (c) rinsing the etchant from the metal;
    (d) removing the resist from the metal; and
    (e) bending said adjacent portions of said design to form a sharp bend along said tabs and thereby resulting in a three-dimensional object of intricate design.

3. The method of claim 2 wherein said masking is accomplished by a process selected from the group consisting of:
    (a) screen printing process;
    (b) wet resist process; and,
    (c) dry resist process.

4. The method of claim 2 wherein said masked metal is exposed to said etchant by spraying said masked metal with said etchant.

5. The method of claim 4 wherein the degree of erosion of said metal is controlled by varying the amount and pressure of said etchant spray when said etchant is sprayed onto said metal.

* * * * *